United States Patent
Jia et al.

(10) Patent No.: US 11,210,229 B2
(45) Date of Patent: Dec. 28, 2021

(54) METHOD, DEVICE AND COMPUTER PROGRAM PRODUCT FOR DATA WRITING

(71) Applicant: EMC IP Holding Company LLC, Hopkinton, MA (US)

(72) Inventors: Ruiyong Jia, Beijing (CN); Shaoqin Gong, Beijing (CN); Chun Ma, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 25 days.

(21) Appl. No.: 16/656,806

(22) Filed: Oct. 18, 2019

(65) Prior Publication Data

US 2020/0133871 A1 Apr. 30, 2020

(30) Foreign Application Priority Data

Oct. 31, 2018 (CN) .......................... 201811291036.4

(51) Int. Cl.
| | | |
|---|---|---|
| *G06F 12/0882* | (2016.01) | |
| *G06F 12/0804* | (2016.01) | |
| *G06F 12/0871* | (2016.01) | |
| *G06F 12/0831* | (2016.01) | |
| *G06F 12/1045* | (2016.01) | |
| *G11C 11/409* | (2006.01) | |
| *G06F 11/07* | (2006.01) | |
| *G11C 11/406* | (2006.01) | |
| *G06F 9/30* | (2018.01) | |

(52) U.S. Cl.
CPC ...... *G06F 12/0882* (2013.01); *G06F 9/30047* (2013.01); *G06F 11/076* (2013.01); *G06F 11/0757* (2013.01); *G06F 12/0804* (2013.01); *G06F 12/0833* (2013.01); *G06F 12/0871* (2013.01); *G06F 12/1054* (2013.01); *G11C 11/409* (2013.01); *G11C 11/40607* (2013.01)

(58) Field of Classification Search
CPC ............ G06F 12/0882; G06F 12/0804; G06F 12/0871; G06F 2212/281
See application file for complete search history.

(56) References Cited

U.S. PATENT DOCUMENTS

| | | | |
|---|---|---|---|
| 7,062,675 B1 | 6/2006 | Kemeny et al. | |
| 8,402,226 B1* | 3/2013 | Faibish | ............... G06F 12/0804 711/143 |
| 10,540,114 B2 | 1/2020 | Lv et al. | |
| 10,810,123 B1 | 10/2020 | Xu et al. | |
| 2005/0278486 A1* | 12/2005 | Trika | ................... G06F 12/0804 711/142 |
| 2011/0246723 A1* | 10/2011 | Van Der Wolf | .... G06F 12/0804 711/143 |
| 2019/0179761 A1* | 6/2019 | Gupta | ...................... G06F 3/065 |
| 2020/0285580 A1* | 9/2020 | Subramanian | .......... G06F 13/16 |

* cited by examiner

*Primary Examiner* — Tracy A Warren
(74) *Attorney, Agent, or Firm* — BainwoodHuang

(57) ABSTRACT

Techniques perform data writing. Such techniques involve: in response to receiving a first write request, searching a cache for a target address associated with the first write request; in response to missing of the target address in the cache, determining a page usage rate in the cache; and in response to determining that the page usage rate exceeds an upper threshold, performing the first write request with a first available page in the cache. The first available page is reclaimed, independent of a refresh cycle of the cache, in response to completing the performing of the first write request.

20 Claims, 4 Drawing Sheets

METHOD, DEVICE AND COMPUTER PROGRAM PRODUCT FOR DATA WRITING

CROSS-REFERENCE TO RELATED APPLICATION

This application claims priority to Chinese Patent Application No. CN201811291036.4, on file at the China National Intellectual Property Administration (CNIPA), having a filing date of Oct. 31, 2018, and having "METHOD, DEVICE AND COMPUTER PROGRAM PRODUCT FOR DATA WRITING" as a title, the contents and teachings of which are herein incorporated by reference in their entirety.

FIELD

Embodiments of the present disclosure generally relate to the field of data processing, and more specifically, to a method, a device and a computer program product for data writing.

BACKGROUND

As the data storage technology develops, various data storage devices are already able to provide growing data storage capacity, and the data access speed has also been improved to a great extent. While improving the data storage capacity, users also put higher demands on data reliability and response time of storage systems.

A technical solution of establishing a storage system based on multi-level storage media with different access speed has already been developed. For example, the frequently-used data can be loaded from storage devices with low access speed into cache devices with high access speed, and the cache devices can further respond to access requests external to the storage system. This solution can improve the response efficiency for the access requests to a certain extent. Therefore, the approach for effectively managing the cache devices to enhance efficiency has become a focus of attention.

SUMMARY

Embodiments of the present disclosure provide a solution of data writing.

In accordance with a first aspect of the present disclosure, there is provided a data writing method. The method includes: in response to receiving a first write request, searching a cache for a target address associated with the first write request; in response to missing of the target address in the cache, determining a page usage rate in the cache; and in response to determining that the page usage rate exceeds an upper threshold, performing the first write request with a first available page in the cache, wherein the first available page is reclaimed, independent of a refresh cycle of the cache, in response to completing the performing of the first write request.

In accordance with a second aspect of the present disclosure, there is provided a device for data writing. The device includes: at least one processing unit; at least one memory coupled to the at least one processing unit and storing instructions for execution by the at least one processing unit, the instructions, when executed by the at least one processing unit, causing the apparatus to perform acts including: in response to receiving a first write request, searching a cache for a target address associated with the first write request; in response to missing of the target address in the cache, determining a page usage rate in the cache; and in response to determining that the page usage rate exceeds an upper threshold, performing the first write request with a first available page in the cache, wherein the first available page is reclaimed, independent of a refresh cycle of the cache, in response to completing the performing of the first write request.

In accordance with a third aspect of the present disclosure, there is provided a computer program product being stored in a non-transitory computer storage medium and including machine-executable instructions. The machine-executable instructions which, when executed by a device, cause the device to perform any step of the method described according to the first aspect of the present disclosure.

This Summary is provided to introduce a selection of concepts in a simplified form that are further described below in the Detailed Description. This Summary is not intended to identify key features or essential features of the present disclosure, nor is it intended to be used to limit the scope of the present disclosure.

BRIEF DESCRIPTION OF THE DRAWINGS

The above and other objectives, features, and advantages of example embodiments of the present disclosure will become more apparent from the following detailed description with reference to the accompanying drawings, in which the same reference symbols refer to the same elements in example embodiments of the present disclosure.

DETAILED DESCRIPTION OF EMBODIMENTS

Figure 1:
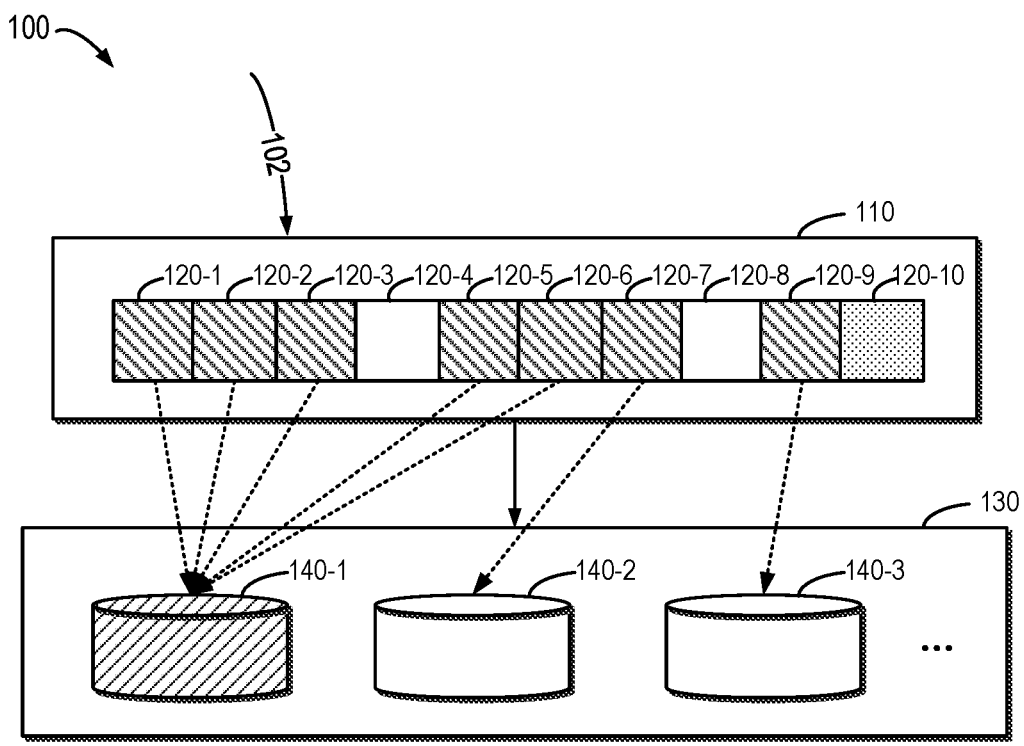
FIG. 1 illustrates an architecture diagram of a storage system where embodiments of the present disclosure can be executed.

The individual features of the various embodiments, examples, and implementations disclosed within this document can be combined in any desired manner that makes technological sense. Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document.

It should be understood that the specialized circuitry that performs one or more of the various operations disclosed herein may be formed by one or more processors operating in accordance with specialized instructions persistently stored in memory. Such components may be arranged in a variety of ways such as tightly coupled with each other (e.g., where the components electronically communicate over a computer bus), distributed among different locations (e.g., where the components electronically communicate over a computer network), combinations thereof, and so on.

Preferred embodiments of the present disclosure will be described as follows in greater detail with reference to the drawings. Although preferred embodiments of the present disclosure are illustrated in the drawings, it is to be understood that the present disclosure described herein can be implemented in various manners, not limited to the embodiments illustrated herein. Rather, these embodiments are provided to make the present disclosure described herein clearer and more complete and convey the scope of the present disclosure described herein completely to those skilled in the art.

As used herein, the term "includes" and its variants are to be read as open-ended terms that mean "includes, but is not limited to." The term "or" is to be read as "and/or" unless the context clearly indicates otherwise. The term "based on" is to be read as "based at least in part on." The term "one example implementation" and "an example implementation" are to be read as "at least one example implementation." The term "another implementation" is to be read as "at least one other implementation." Terms "a first", "a second" and others can denote different or identical objects. The following text may also contain other explicit or implicit definitions.

As described above, a technical solution of establishing a storage system based on multi-level storage media with different access speed has already been developed. FIG. 1 illustrates a storage system 100 where embodiments of the present disclosure can be executed. As shown in FIG. 1, the storage system 100 can include a cache 110 and a storage device pool 130, which can consist of a plurality of independent physical storage devices, such as storage devices 140-1 to 140-3 (collectively or individually referred to as storage device 140). In some embodiments, the storage device 140 can be Hard Disk Drive (HDD), Solid-State Disk (SSD) or flash memory etc.

As shown in FIG. 1, the cache 110 can include a plurality of cache pages 120-1 to 120-10 (collectively or individually referred to as cache page 120). Traditionally, when the storage system 100 receives a write request 102, the storage system 100 can determine whether the cache 110 hits a target address for a write request 102. In the case that the cache 110 misses the target address, the storage system 100 writes data associated with the write request 102 with an available cache page (e.g., page 120-10) in the cache 110 and then marks the page 120-10 as dirty. At this point, the storage system 100 reports that the execution of the write request 102 has been completed and periodically flushes the dirty data (indicated by right slash in FIG. 1) in the cache 110 to a corresponding storage device 140.

In the traditional solution, once the I/O performance of the storage device 140 decreases due to influence of some factors, the storage system 100 would inhibit a new write request for the storage device 140. For example, the storage system 100 can suspend a new write request, and then the upper-layer file system usually will not send a new write request until receiving an indication that the execution of a previous request has been completed. However, the file system is not able to know the status of the storage system 100 and might suddenly send a large amount of write requests within a short period of time. All of these write requests will be suspended and their executions may have to be completed after a long time, which significantly affects the performance of the storage system 100. In addition, the uncompleted write requests would also occupy a large number of cache pages in the cache 110, which further influences the response of the storage system 100 for other write requests.

In accordance with embodiments of the present disclosure, there is provided a data writing solution. In this solution, when determining that the cache misses an address for a received write request, the storage system determines a usage rate of the cache page, and performs the write request with available pages in the cache if the page usage rate exceeds an upper threshold, and reclaims, independent of a refresh cycle of the cache, the available pages after completing the execution of the write request. In this way, the storage system can ensure that there are always a certain amount of available cache pages for responding to the write requests and these available cache pages will not be depleted, which improves the performance of the storage system.

Figure 2:
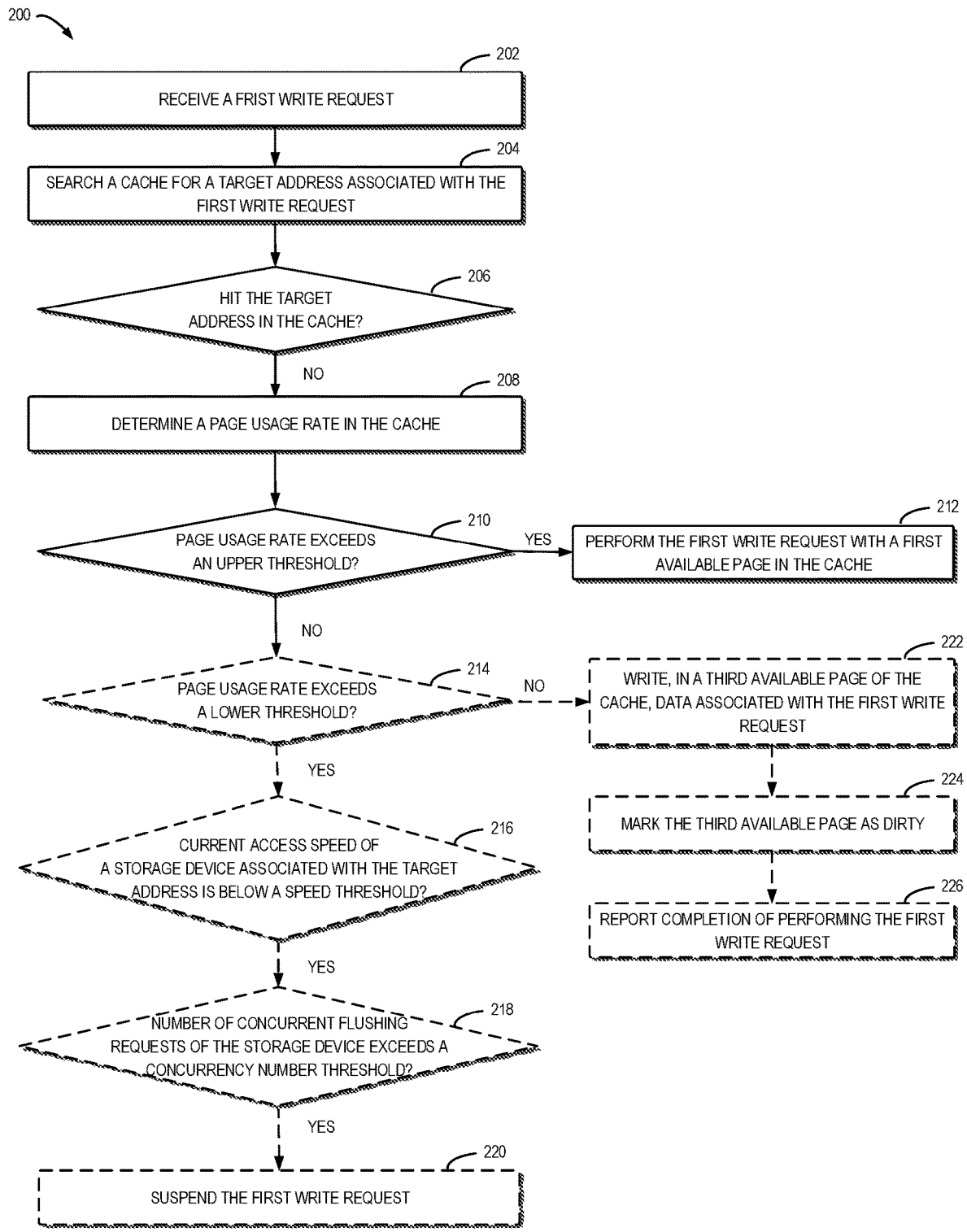
FIG. 2 illustrates a flowchart of a method of data writing in accordance with embodiments of the present disclosure.

FIG. 2 illustrates a flowchart of a data writing method 200 in accordance with embodiments of the present disclosure. The method 200 can be implemented by the cache 110 in the storage system 100. Acts involved in the method 200 will be described below with reference to the storage system 100 shown in FIG. 1.

At block 202, the cache 110 receives a write request (hereinafter referred to as "first write request" for the sake of description). For example, by taking the write request 102 in FIG. 1 as an example, the cache 110 can receive the write request 102 from an associated file system (not shown in FIG. 1), to write the target data associated with the write request 102 into the target address.

At block 204, in response to receiving the first write request 102, the cache 110 searches the cache 110 for the target address associated with the first write request 102. The cache 110 determines, at block 206, whether the target address is hit therein. Specifically, the cache 110 can include a plurality of cache pages 120, and each of plurality of cache pages 120can be associated with a particular file system address. The cache 110 can compare an address corresponding to the cache page 120 with the target address for the first write request 120, so as to determine whether the target address is hit in the cache 110.

When it is determined, at block 206, that the target address is not hit in the cache 110, the method 200 proceeds to block 208. On the contrary, if the cache 110 hits the target address, the cache 110 can normally execute the write request 102 as the write request 102 will not consume any additional cache page.

At block 208, in response to missing the target address in the cache 110, the cache 110 determines a page usage rate in the cache 110. Continue to refer to the example of FIG. 1. A block indicated by right slash in the cache page 120 represents that the page is dirty, i.e., already used. As shown in FIG. 1, the cache pages 120-1, 120-2, 120-3, 120-5, 120-6, 120-7 and 120-9 are pages being used. By taking FIG. 1 as the example, the page usage rate in the cache 110 is 70%.

At block 210, the cache 110 determines whether the page usage rate exceeds an upper threshold. Continue to refer to the example of FIG. 1. The upper threshold, for example, can be set to 65%. It should be understood that such numeric value is only by way of example in the embodiments of the present disclosure and those skilled in the art can readily envisage setting other suitable numeric values.

When it is determined, at block 210, that the page usage rate exceeds the upper threshold, the method 200 proceeds to block 212, i.e., in response to determining that the page usage rate is below a lower threshold, the cache 110 performs the first write request 102 with an available page (hereinafter referred to as "first available page" for the sake of description) in the cache 110, where in the first available page is reclaimed, independent of a refresh cycle of the cache, in response to completing the performing of the first write request 102. Continue to refer to the example of FIG. 1. The cache 110 can perform the first write request 102 with the available page 120-10 in the cache 110. Specifically, when the first write request 102 is performed, the traditional write back mode will not be used by the storage system 100. In the traditional write back mode, the cache reports completion of the write request immediately after writing the data into the cache page and then the storage system 100 periodically flushes the data in the cache page to the storage device.

Figure 3:
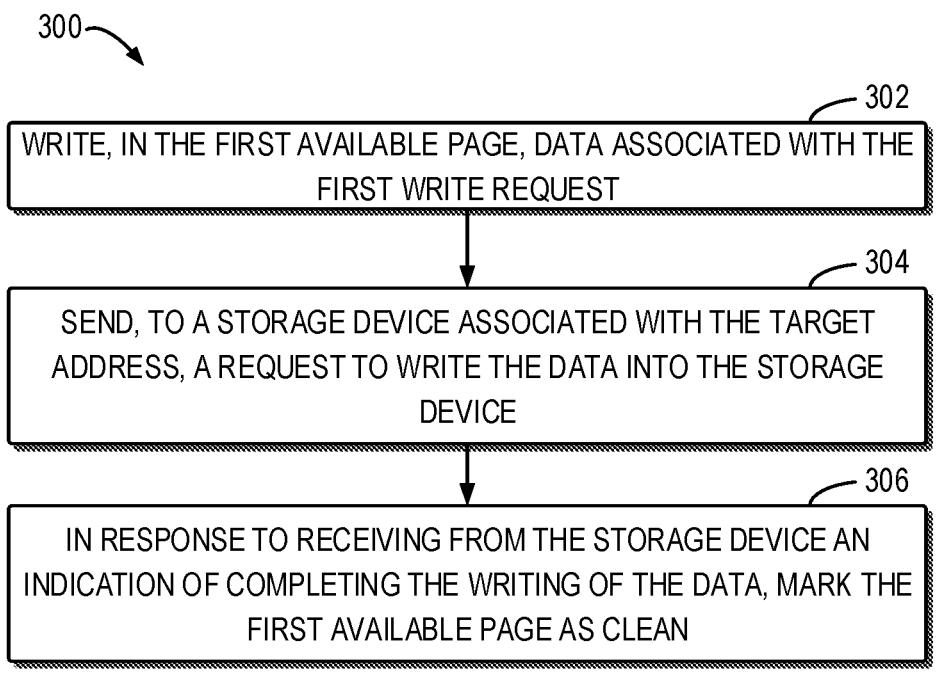
FIG. 3 illustrates a flowchart of a method of performing a write request in accordance with embodiments of the present disclosure.

In accordance with the solution of the present disclosure, the cache 110 performs the first write request 102 with the first available page 120-10 and writes the data into the storage device 140 in real time without considering the refresh cycle of the cache 110. Specifically, a flowchart of a process 300 for executing the first write request 102 in accordance with embodiments of the present disclosure is described below with reference to FIG. 3.

At block 302, the cache 110 writes the data associated with the first write request 102 in the first available page 120-10. Specifically, the cache 110 can write the target data in the first available page 102, establishes a correlation between the first available page 120-10 and the target address, and locks the first available page 120-10, to prevent other requests from writing data.

At block 304, the cache 110 sends to the storage device associated with the target address a request to write the data into the storage device. Continue to refer to the example of FIG. 1. The write request 102, for example, can be associated with the storage device 140-2. The cache 110 can send a request to the storage device 140-2 and writes the target data into a storage space associated with the target address in the storage device 140-2. In response to receiving the request, the storage device 140-2 can write the target data into the target storage space associated with the target address, and then send to the cache 110 after completing the write an indication that the writing of the data associated with the first write request 102 has been completed.

At block 306, in response to receiving an indication about the completion of writing of data from the storage device, the cache 110 marks the first available page 120-10 as clean, such that the page 120-10 can be continually used for other write requests. It is therefore ensured that there are always a certain amount of available cache pages in the cache 110 for responding to the write request.

In some embodiments, when the first write request 102 is completed, the cache 110 can periodically determine a write request (hereinafter referred to as "second write request" for the sake of description) from a set of the suspended write requests, wherein the second write request is suspended for a duration exceeding a predetermined time threshold. For example, the cache 110 can determine the second write request to be a request which is suspended and requests for writing at the earliest time. In some embodiments, the cache 110 can perform the second write request with an available page (hereinafter referred to as "second available page" for the sake of description) in the cache 110. In this way, the cache 110 can ensure that the write request which is suspended for an overlong time can be processed in priority with reserved available cache pages.

Based on the above procedure, the method of the present disclosure may guarantee that: in a case that a number of the available cache pages in the cache are low, the cache pages occupied by each write request can be timely returned without waiting for the regular refresh time of the cache, which improves the response efficiency of the storage system. In addition, the method of the present disclosure also can ensure that there are always a certain amount of available cache pages in the cache for responding to the write request, which avoids the depletion of the cache pages.

Continue to refer to FIG. 2. In response to determining, at block 210, that the page usage rate is below or equal to the upper threshold, the method 200 can proceed to block 214, i.e., determining whether the page usage rate exceeds the lower threshold. For example, the lower threshold can be set to 40%. It should be understood that such numeric value is only by way of example in the embodiments of the present disclosure and those skilled in the art can readily envisage setting other suitable numeric values.

Continue to refer to example of FIG. 1. When one or more used cache pages in the cache 110 are marked as clean in response to completion of flushing the cache pages to the storage device 140, the page usage rate in the cache 110 may change. For example, assuming that the pages 120-1 and 120-2 have been refreshed and marked as clean before receipt of the write request 102, the page usage rate of the cache 110 is now changed to be 50%, which is below the upper threshold 70% and greater than the lower threshold 40%.

In response to determining, at block 214, that the page usage rate exceeds the lower threshold, the method 200 can proceed to block 216, i.e., determining whether a current access speed of the storage device 140-2 associated with the target address is below a speed threshold. If yes, the process 200 proceeds to block 218; otherwise, the cache 110 will normally perform the first write request 102.

In response to determining, at block 216, that the current access speed is below the speed threshold, the process 200 proceeds to block 218, i.e., the cache 110 determines whether the number of concurrent flushing requests for the storage device 140-2 exceeds a concurrency number threshold. In some embodiments, the current access speed can represent an average speed of completing the flushing requests for the storage device 140-2 within a predetermined period of time. When the access speed is low, the write request for the storage device 140-2 should be inhibited, i.e., allowing the flushing requests with a number below the concurrency number threshold only.

In response to determining, at block 218, that the number exceeds the concurrency number threshold, the process 200 proceeds to block 220, i.e., the cache 110 suspends the first write request 102. In some embodiments, the cache 110 can append the first write request 102 into a pending execution queue for the storage device 140-2, and record a timestamp of the first write request 102.

In some embodiments, the cache 110 also can detect whether there are suspended requests for the target storage device 140-2, and suspend the first write request 102 in response to determining that there are suspended requests. In this way, the cache 110 can ensure that: when the response speed of the storage device 140-2 is low, the file system is inhibited from continually sending more write requests by suspending the write request.

In some embodiments, in response to determining that the number is below or equal to the concurrent number threshold at block 218, the cache 110 can normally perform the first write request 102. In some embodiments, in response to completing the first write request 102, the cache 110 can wake up a third suspended write request associated with the storage device 140-2. In some embodiments, the cache 110 can choose, from the pending execution queue of the storage device 140-2, a third write request with the earliest timestamp for execution.

In response to determining, at block 214, that the page usage rate is below or equal to the lower threshold, the process 200 can proceed to block 222, i.e., the cache 110 writes the data associated with the first write request 102 into an available page (hereinafter referred to as "third available page" for the sake of description) in the cache. Continue to refer to FIG. 1. When one or more used cache pages in the cache 110 are further marked as clean in response to completion of flushing the cache pages to the storage device 140, the page usage rate in the cache 110 may change. For example, assuming the pages 120-1, 120-2, 120-3 and 120-6 have already been flushed and marked as clean before receipt of the write request 102, the page usage rate of the cache 110 is changed to be 30%, which now is below the lower threshold 40%. Therefore, the cache 110, for example, can write the data associated with the first write request 102 with the third available page 120-1.

At block 224, the cache 110 marks the third available page as dirty. Continue to refer to FIG. 1. The cache 110 can mark the third available page as dirty and wait for regular refresh of the cache 110. At block 226, the cache 110 can report to the file system the completion of the first write request 102, so as to reduce the response time for the write request of the file system.

Figure 4:
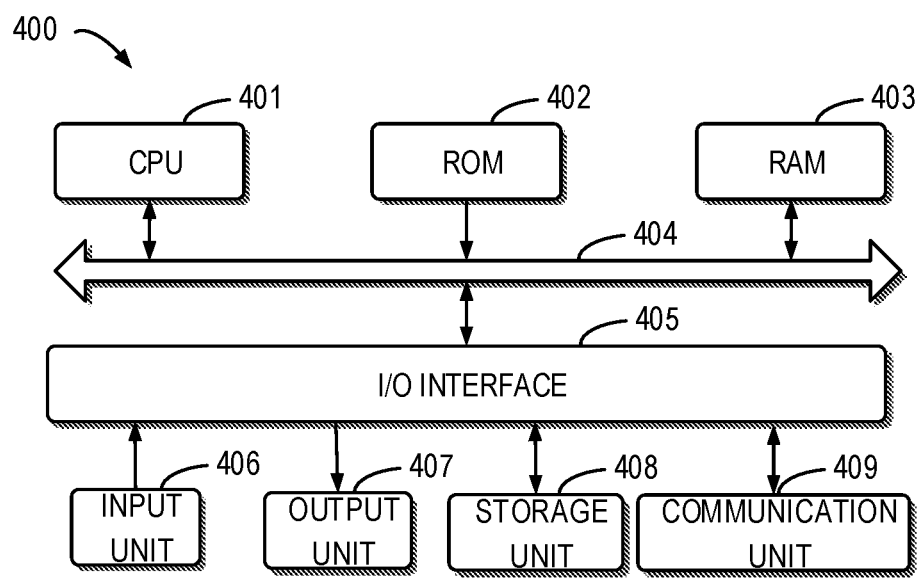
FIG. 4 illustrates a schematic block diagram of an example device for implementing embodiments of the present disclosure.

FIG. 4 illustrates a schematic block diagram of an example device 400 for implementing embodiments of the present disclosure. For example, a computing device performing management functions in the storage system 100 of FIG. 1 can be implemented by the device 400. As shown in FIG. 4, the apparatus 400 includes a central processing unit (CPU) 401 which is capable of performing various processes in accordance with computer program instructions stored in a read only memory (ROM) 402 or computer program instructions loaded from a storage unit 408 to a random access memory (RAM) 403. In the RAM 403 are stored various programs and data as required by operation of the apparatus 400. The CPU 401, the ROM 402 and the RAM 403 are connected to one another via a bus 404. An input/output (I/O) interface 405 is also connected to the bus 404.

The following components in the device 400 are connected to the I/O interface 405: an input unit 406 including a keyboard, a mouse, or the like; an output unit 407 such as various types of displays and speakers; the storage unit 408 such as a magnetic disk or optical disk; and a communication unit 409 such as a network card, a modem, a wireless communication transceiver or the like. The communication unit 409 allows the device 400 to exchange information/data with other devices through a computer network such as the Internet and/or various types of telecommunication networks.

The processing unit 401 performs various method and processes described above, for example method 200 and/or method 300. For example, in some embodiments, the method 200 and/or method 300 may be implemented as a computer software program or computer program product, which is tangibly contained in a machine-readable medium, for example the storage unit 408. In some embodiments, part or all of the computer program may be loaded and/or installed on the device 400 via ROM 402 and/or communication unit 409. When the computer program is loaded in the RAM 403 and executed by CPU 401, one or more acts of the method 200 and/or method 300 described above may be executed.

The present disclosure may be a method, an apparatus, a system and/or a computer program product. The computer program product may include a computer readable storage medium (or media) having computer readable program instructions thereon for causing a processor to perform aspects of the present disclosure.

The computer readable storage medium may be a tangible device that may retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination of the foregoing. Non-exhaustive and more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other electromagnetic waves propagating freely, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to implement aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processing unit of the computer or other programmable data processing apparatus, create means (e.g., specialized circuitry) for implementing the functions/actions specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/actions specified in the flowchart and/or block diagram block or blocks.

The flowchart and block diagrams illustrate the architecture, functionality, and operation of possible implementations of systems, methods and computer program products according to various embodiments of the present disclosure. In this regard, each block in the flowchart or block diagrams may represent a module, snippet, or portion of code, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reversed order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or actions, or combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of data writing, comprising:
   in response to receiving a first write request, searching a cache for a target address associated with the first write request;
   in response to missing of the target address in the cache, determining a page usage rate in the cache;
   in response to determining that the page usage rate exceeds an upper threshold, performing the first write request with a first available page in the cache, wherein the first available page is reclaimed, independent of a refresh cycle of the cache, in response to completing the performing of the first write request;
   in response to determining that the page usage rate is below or equal to the upper threshold, determining whether the page usage rate exceeds a lower threshold, the upper threshold being greater than the lower threshold;
   in response to determining that the page usage rate exceeds the lower threshold, determining whether a current access speed of a storage device associated with the target address is below a speed threshold; and
   in response to the current access speed being below the speed threshold, determining whether a number of concurrent flushing requests of the storage device exceeds a concurrency number threshold; and
   in response to the number exceeding the concurrency number threshold, suspending the first write request.

2. The method of claim 1, wherein performing the first write request comprises:
   writing, in the first available page, data associated with the first write request;
   sending, to a storage device associated with the target address, a request to write the data into the storage device; and
   in response to receiving from the storage device an indication of completing the writing of the data, marking the first available page as clean.

3. The method of claim 2, further comprising:
   periodically determining a second write request from a set of suspended write requests, the second write request being suspended for a duration exceeding a predetermined time threshold; and
   performing the second write request with a second available page in the cache.

4. The method of claim 1, further comprising:
   in response to the number being below or equal to the concurrency number threshold, performing the first write request; and
   in response to completing the first write request, waking up a third suspended write request associated with the storage device.

5. The method of claim 1, further comprising:
   in response to determining that the page usage rate is below or equal to a lower threshold, writing, in a third available page of the cache, data associated with the first write request;
   marking the third available page as dirty; and
   reporting completion of performing the first write request.

6. A device for data writing, comprising:
   at least one processing unit;
   at least one memory coupled to the at least one processing unit and storing instructions for execution by the at least one processing unit, the instructions, when executed by the at least one processing unit, causing the apparatus to perform acts comprising:
- in response to receiving a first write request, searching a cache for a target address associated with the first write request;
- in response to missing of the target address in the cache, determining a page usage rate in the cache;
- in response to determining that the page usage rate exceeds an upper threshold, performing the first write request with a first available page in the cache, wherein the first available page is reclaimed, independent of a refresh cycle of the cache, in response to completing the performing of the first write request;
- in response to determining that the page usage rate is below or equal to the upper threshold, determining whether the page usage rate exceeds a lower threshold, the upper threshold being greater than the lower threshold;
- in response to determining that the page usage rate exceeds the lower threshold, determining whether a current access speed of a storage device associated with the target address is below a speed threshold; and
- in response to the current access speed being below the speed threshold, determining whether a number of concurrent flushing requests of the storage device exceeds a concurrency number threshold; and
- in response to the number exceeding the concurrency number threshold, suspending the first write request.

7. The device of claim 6, wherein executing the first write request comprises:
- writing, in the first available page, data associated with the first write request;
- sending, to a storage device associated with the target address, a request to write the data into the storage device; and
- in response to receiving from the storage device an indication of completing writing of the data, marking the first available page as clean.

8. The device of claim 7, wherein the acts further comprise:
- periodically determining a second write request from a set of suspended write requests, the second write request being suspended for a duration exceeding a predetermined time threshold; and
- performing the second write request with a second available page in the cache.

9. The device of claim 6, wherein the acts further comprise:
- in response to the number being below or equal to the concurrency number threshold, performing the first write request; and
- in response to completing the first write request, waking up a third suspended write request associated with the storage device.

10. The device of claim 6, wherein the acts further comprise:
- in response to determining that the page usage rate is below or equal to a lower threshold, writing, in a third available page of the cache, data associated with the first write request;
- marking the third available page as dirty; and
- reporting completion of performing the first write request.

11. A computer program product being stored in a non-transitory computer storage medium and comprising machine-executable instructions which, when executed by a device, cause the device to perform acts comprising:
- in response to receiving a first write request, searching a cache for a target address associated with the first write request;
- in response to missing of the target address in the cache, determining a page usage rate in the cache;
- in response to determining that the page usage rate exceeds an upper threshold, performing the first write request with a first available page in the cache, wherein the first available page is reclaimed, independent of a refresh cycle of the cache, in response to completing the performing of the first write request;
- in response to determining that the page usage rate is below or equal to the upper threshold, determining whether the page usage rate exceeds a lower threshold, the upper threshold being greater than the lower threshold;
- in response to determining that the page usage rate exceeds the lower threshold, determining whether a current access speed of a storage device associated with the target address is below a speed threshold; and
- in response to the current access speed being below the speed threshold, determining whether a number of concurrent flushing requests of the storage device exceeds a concurrency number threshold; and
- in response to the number exceeding the concurrency number threshold, suspending the first write request.

12. The computer program product of claim 11, wherein executing the first write request comprises:
- writing, in the first available page, data associated with the first write request;
- sending, to a storage device associated with the target address, a request to write the data into the storage device; and
- in response to receiving from the storage device an indication of completing the writing of the data, marking the first available page as clean.

13. The computer program product of claim 12, wherein the acts further comprise:
- periodically determining a second write request from a set of suspended write requests, the second write request being suspended for a duration exceeding a predetermined time threshold; and
- performing the second write request with a second available page in the cache.

14. The computer program product of claim 11, wherein the acts further comprise:
- in response to the number being below or equal to the concurrency number threshold, performing the first write request; and
- in response to completing the first write request, waking up a third suspended write request associated with the storage device.

15. The computer program product of claim 11, wherein the acts further comprise:
- in response to determining that the page usage rate is below or equal to a lower threshold, writing, in a third available page of the cache, data associated with the first write request;
- marking the third available page as dirty; and
- reporting completion of performing the first write request.

16. The method of claim 1, wherein determining the page usage rate in the cache comprises:
- evaluating a number of pages in the cache being used versus a number of pages in the cache to identify the page usage rate.

17. A method of data writing, comprising:
- in response to receiving a first write request, searching a cache for a target address associated with the first write request;
- in response to missing of the target address in the cache, determining a page usage rate in the cache;
- in response to determining that the page usage rate exceeds an upper threshold, performing the first write request with a first available page in the cache, wherein the first available page is reclaimed, independent of a refresh cycle of the cache, in response to completing the performing of the first write request;
- in response to determining that the page usage rate is below or equal to a lower threshold, writing, in a third available page of the cache, data associated with the first write request;
- marking the third available page as dirty; and
- reporting completion of performing the first write request.

18. A device for data writing, comprising:
- at least one processing unit;
- at least one memory coupled to the at least one processing unit and storing instructions for execution by the at least one processing unit, the instructions, when executed by the at least one processing unit, causing the apparatus to perform acts comprising:
  - in response to receiving a first write request, searching a cache for a target address associated with the first write request;
  - in response to missing of the target address in the cache, determining a page usage rate in the cache;
  - in response to determining that the page usage rate exceeds an upper threshold, performing the first write request with a first available page in the cache, wherein the first available page is reclaimed, independent of a refresh cycle of the cache, in response to completing the performing of the first write request;
  - in response to determining that the page usage rate is below or equal to a lower threshold, writing, in a third available page of the cache, data associated with the first write request;
  - marking the third available page as dirty; and
  - reporting completion of performing the first write request.

19. A computer program product being stored in a non-transitory computer storage medium and comprising machine-executable instructions which, when executed by a device, cause the device to perform acts comprising:
- in response to receiving a first write request, searching a cache for a target address associated with the first write request;
- in response to missing of the target address in the cache, determining a page usage rate in the cache;
- in response to determining that the page usage rate exceeds an upper threshold, performing the first write request with a first available page in the cache, wherein the first available page is reclaimed, independent of a refresh cycle of the cache, in response to completing the performing of the first write request;
- in response to determining that the page usage rate is below or equal to a lower threshold, writing, in a third available page of the cache, data associated with the first write request;
- marking the third available page as dirty; and
- reporting completion of performing the first write request.

20. The device of claim 6, wherein determining the page usage rate in the cache comprises:
- evaluating a number of pages in the cache being used versus a number of pages in the cache to identify the page usage rate.

* * * * *